United States Patent [19]
Okumura

[11] Patent Number: 5,328,078
[45] Date of Patent: Jul. 12, 1994

[54] CONNECTION METHOD AND CONNECTION DEVICE FOR ELECTRICAL CONNECTION OF SMALL PORTIONS

[75] Inventor: Katsuya Okumura, Yokohama, Japan
[73] Assignee: Kabushiki Kaisha Toshiba, Kawasaki, Japan
[21] Appl. No.: 132,211
[22] Filed: Oct. 6, 1993

Related U.S. Application Data

[63] Continuation of Ser. No. 813,670, Dec. 27, 1991, abandoned.

[30] Foreign Application Priority Data

Jan. 9, 1991 [JP] Japan .................. 3-062764

[51] Int. Cl.$^5$ .................. H01L 21/60; B23K 31/02
[52] U.S. Cl. .................. 228/179.1; 228/205; 228/217; 228/248.1; 427/99
[58] Field of Search .............. 228/179.1, 205, 206, 228/217, 248.1, 261; 427/99

[56] References Cited

U.S. PATENT DOCUMENTS 3,116,549  1/1964  Born et al. .................. 228/217

FOREIGN PATENT DOCUMENTS 3304672  8/1984  Fed. Rep. of Germany ...... 228/261
3501410  7/1986  Fed. Rep. of Germany ...... 228/261

OTHER PUBLICATIONS

"Abrasive Blast Cleaning," *Metals Handbook*, 9th Ed., vol. 5, 1982, pp. 83–86.
Patent Abstract of Japanese Publication No. JP1084738 dated Mar. 30, 1989.
Patent Abstract of Japanese Publication No. JP3046395 dated Feb. 27, 1991.
Patent Abstract of Japanese Publication No. JP55067133 dated May 21, 1980.
European Patent Office Search Report for Application No. 91122420.2 dated Oct. 9, 1992.

*Primary Examiner*—P. Austin Bradley
*Assistant Examiner*—Jeffrey T. Knapp
*Attorney, Agent, or Firm*—Finnegan, Henderson, Farabow, Garrett & Dunner

[57] ABSTRACT

A first portion is set near or in contact with a second portion. The first and second portions are electrically connected by spraying fine metal particles particles of gold, nickel or copper in a carrier gas of helium, argon, hydrogen or nitrogen on the first and second portions to form a metal bump. Prior to spraying the fine metal particles to form the metal bump, hard particles of titanium, copper, hafnium, zirconium or vanadium may be sprayed on the first and second portions to remove contamination layers.

15 Claims, 6 Drawing Sheets

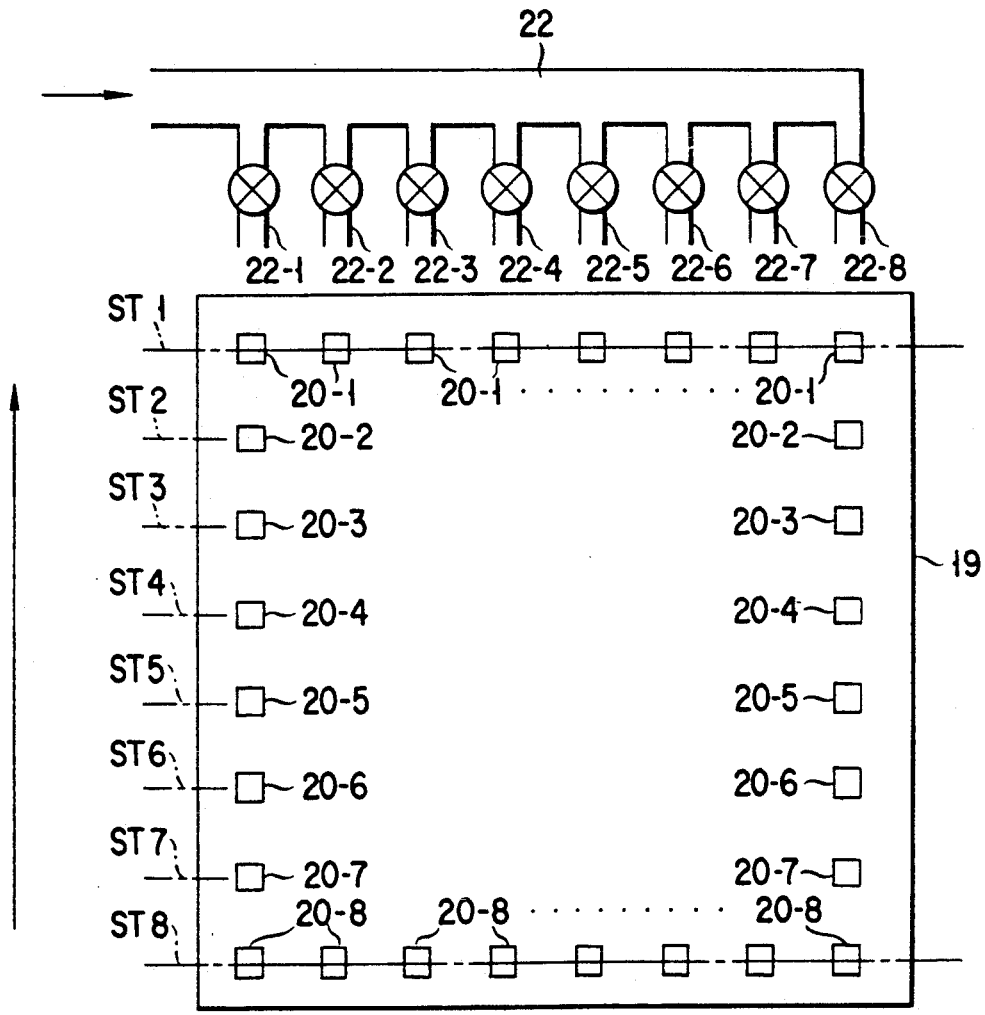
F I G. 4

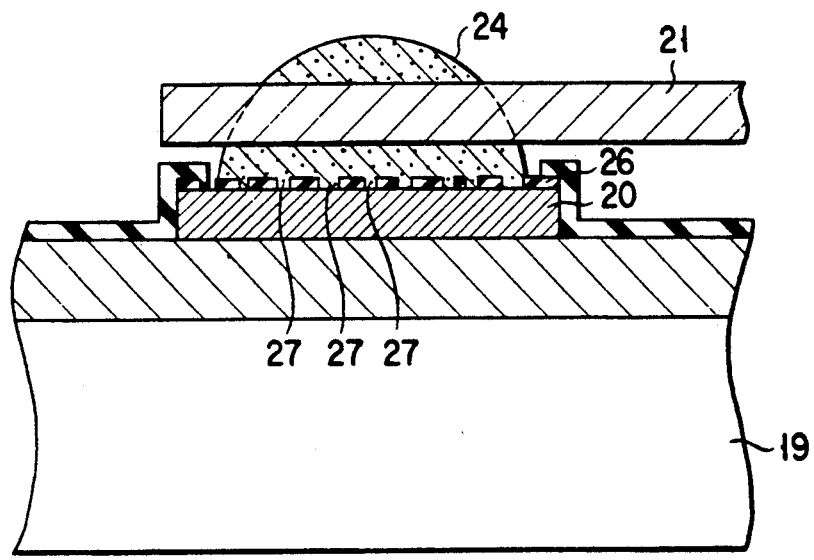
F I G. 5
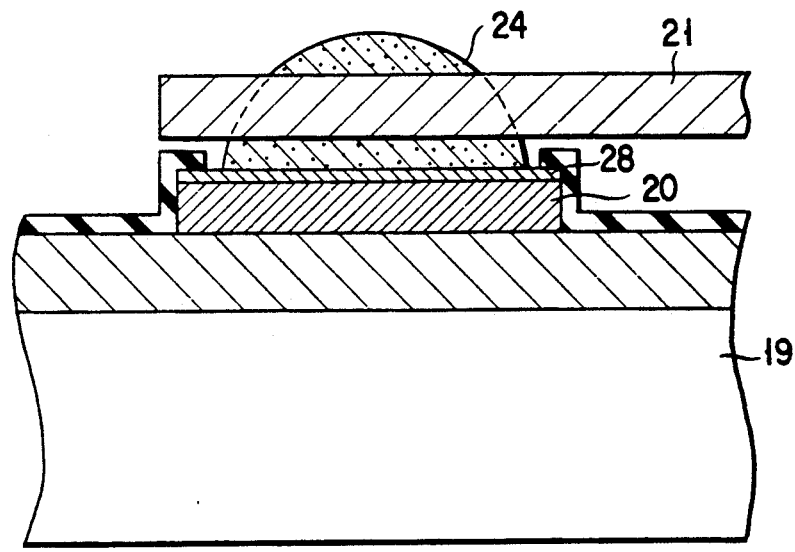
F I G. 6

F I G. 9
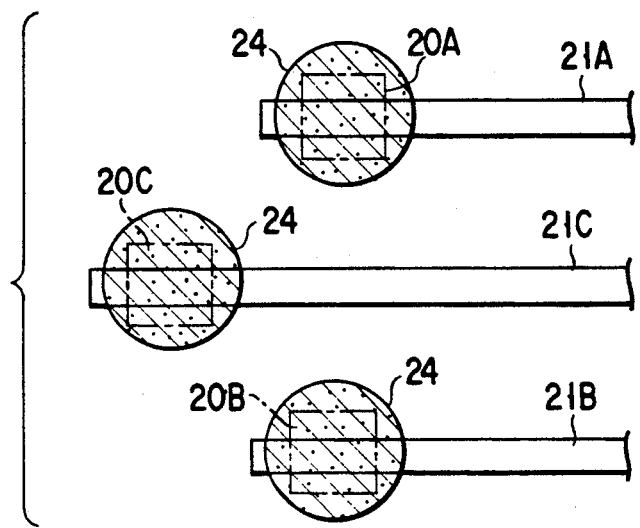
F I G. 10
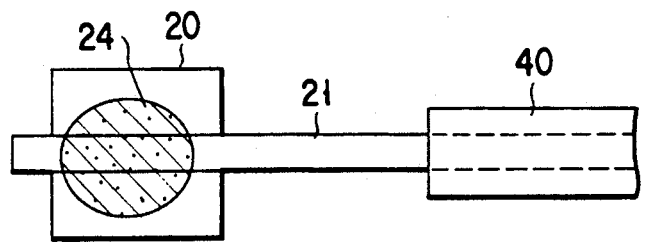
F I G. 11
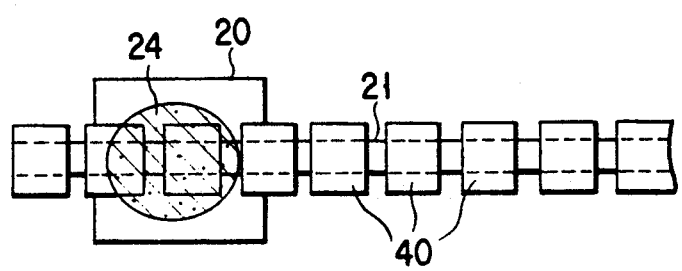

CONNECTION METHOD AND CONNECTION DEVICE FOR ELECTRICAL CONNECTION OF SMALL PORTIONS

This application is a continuation of U.S. patent application Ser. No. 07/813,670, filed Dec. 27, 1991, now abandoned.

BACKGROUND OF THE INVENTION

1. Field of the Invention

This invention relates to a connection method and a connection device for electrical connection of small portions, in particular, various portions in electronic parts, etc.

2. Description of the Related Art

In order to electrically connect the inner lead portion of a lead frame and a bonding pad formed on a semiconductor chip, a wire bonding method using a gold wire or aluminum wire is generally used. Recently, methods of forming a bump on a bonding pad and electrically connecting the bump to the wiring pattern formed on a film cartlet or electrically connecting the bump to the wiring pattern formed on the board as in TAB (tape automated bonding) or flip-chip bonding have been used. With the above methods, the bonding pad and the bonding wire, the bonding wire and the inner lead portion, and the bump and the wiring pattern are electrically connected to each other by metal bonding. Further, soldering is often used for electrical connection at the time of mounting of electronic parts on the printed-circuit board.

However, the wire bonding method has defects that the arrangement of elements formed on the semiconductor chip is limited and it is difficult to reduce the pitch between the pads. That is, in order to connect the bonding wire and the bonding pad to each other by metal bonding, it is necessary to apply a physical load such as heat, pressure or ultrasonic vibration to the connection portion. Therefore, when a semiconductor element is formed in an area directly under the bonding pad, the element may be damaged and the characteristic thereof may be deteriorated. Thus, the semiconductor element cannot be formed in an area near or directly under the bonding pad. Further, since the shortest distance between adjacent bonding wires is limited by the outer diameter of a bonding capillary, it is practically difficult to reduce the pitch between the pads to be less than 100 $\mu$m. For this reason, the chip size of a semiconductor chip in which a large number of pads are required to be formed must be increased.

In a connection method using no bonding wire, unlike TAB or flip-chip bonding, a larger amount of heat and a higher pressure may be often applied to the connection portion than in the wire bonding method. For this reason, the elements formed in the semiconductor chip may be often damaged. Further, the pad pitch may be reduced to less than approx. 80 $\mu$m, but since it is not preferable to reduce the size of the bump from the viewpoint of the mechanical strength, reduction in the pad pitch is limited. Further, since a large number of bumps and a large number of wiring patterns are connected at the same time, the heights of the bumps must be made constant and the connection position must be precisely determined. Thus, the connection method, such as TAB and flip-chip bonding, has the defects that various conditions for connection are severe, variation in the connection state and connection strength tends to occur and it is difficult to attain the stable connection.

In a case where electronic parts are mounted on the printed-circuit board, for example, where the outer lead portion of the semiconductor device is connected to the wiring pattern formed on the printed-circuit board by soldering, solder must be previously attached to the outer lead portion. Further, flux or the like must be coated on a to-be-connected portion. In addition, it is necessary to remove the flux by using organic solvent after the soldering is completed. Thus, the connection method using solder requires a large number of working steps, the working efficiency is low and the reliability thereof is low. Further, since the organic solvent and solder vapor are harmful, the environmental protection measure must be taken and the manufacturing cost will be increased.

SUMMARY OF THE INVENTION

Accordingly, a first object of this invention is to provide a connection method for electrically connecting small portions without causing mechanical and thermal damages.

A second object of this invention is to provide a connection device for electrically connecting small portions without causing mechanical and thermal damages.

The first object can be attained by a connection method comprising a first step of positioning a first to-be-connected portion near or in contact with a second to-be-connected portion; and a second step of electrically connecting the first and second to-be-connected portions by spraying fine metal particles on the first and second to-be-connected portions to fixedly attach a metal bump thereto.

According to the above connection method, since it is not necessary to apply a physical load, such as heat, pressure and ultrasonic vibration to the connection portion, the small portions can be electrically connected without causing mechanical and thermal damages.

The second object can be attained by a connection device comprising fine metal particle creation means for creating fine metal particles carrying means for carrying fine metal particles created by the fine metal particle creation means together with carrier gas; spraying means for spraying fine metal particles and carrier gas carried by the carrying means on to-be-connected portions to form a metal bump so as to electrically connect the to-be-connected portions.

According to the above connection device, since the to-be-connected portions are electrically connected to each other by spraying fine metal particles together with the carrier gas on the to-be-connected portions and forming the bump on the to-be-connected portions, small portions can be electrically connected without causing mechanical and thermal damages.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is an enlarged plan view showing an extracted portion including the semiconductor chip and nozzles, for illustrating the connection device and connection method according to another embodiment of this invention;

FIG. 5 is a cross sectional view for illustrating the connection method according to another embodiment of this invention;

FIG. 6 is a cross sectional view for illustrating the connection method according to still another embodiment of this invention;

FIG. 9 is a plan view showing an example of the arrangement of pads which is suitable when the connection method of this invention is used;

FIG. 10 is a plan view for illustrating the connection method according to still another embodiment of this invention; and FIG. 11 is a plan view for illustrating the connection method according to another embodiment of this invention.

DETAILED DESCRIPTION OF THE PREFERRED EMBODIMENTS

Figure 1:
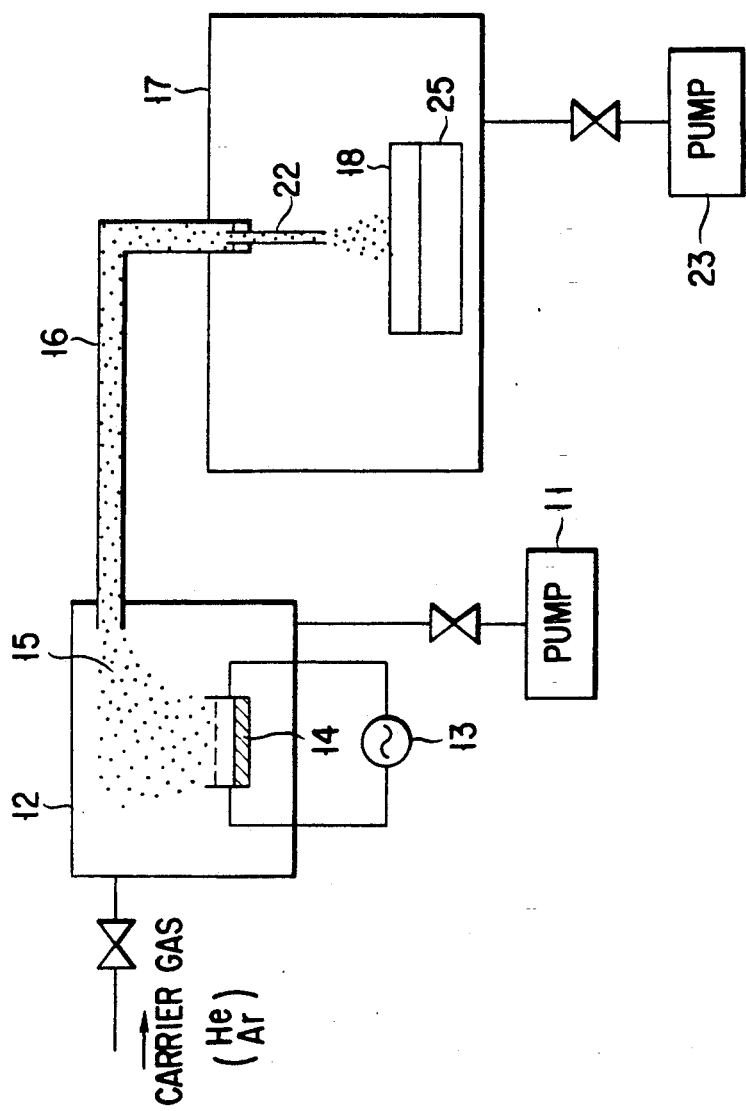
FIG. 1 is a schematic construction diagram showing a connection device according to one embodiment of this invention.

FIG. 1 shows a schematic construction of a connection device according to an embodiment of this invention.

A storage unit 14 for metal, for example, Au (gold) is provided in a superfine particle creation chamber 12 and superfine particles 15 of Au are created by heating and vaporizing Au stored in the storage unit 14 by a vaporizing device 13. The pressure in the superfine particle creation chamber 12 is adjusted to 0.5 to 2 atmosphere by means of a pump 11. A carrier gas such as He (helium) gas, Ar (argon) gas, $H_2$ (hydrogen) gas or $N_2$ (nitrogen) gas is introduced into the creation chamber 12. The superfine particles 15 are fed together with the carrier gas into a deposition chamber 17 via a carrying pipe 16 and sprayed out from a thin nozzle 22 with a diameter of approx. 70 $\mu$m mounted on the front end portion of the carrying pipe 16. A mounting table 18 for mounting a connection member thereon is disposed in the deposition chamber 17, a to-be-connected portion of the connection member is disposed to face the outlet of the nozzle 22 which is set above the mounting table 18, and the carrier gas containing the superfine particles 15 is sprayed on the to-be-connected portion. The pressure in the deposition chamber 17 is adjusted to a low pressure of approx. 0.1 Tort by use of a pump 23. Further, a heating device 25 for heating the mounting table 18 at the time of connection is disposed in the deposition chamber 17.

Next, a connection method by using the device of FIG. 1 is explained.

First, the pressure in the superfine particle creation chamber 12 is set to 0.5 to 2 atmosphere by the pump 11. In this state, the storage unit 14 is heated by the vaporizing device 13 to vaporize Au and create superfine particles with a diameter of less than 0.1 $\mu$m. Then, carrier gas is introduced into the superfine particle creation chamber 12 so as to permit the superfine particles 15 to be fed together with the carrier gas into the deposition chamber 17 via the carrying pipe 16.

Figure 2:
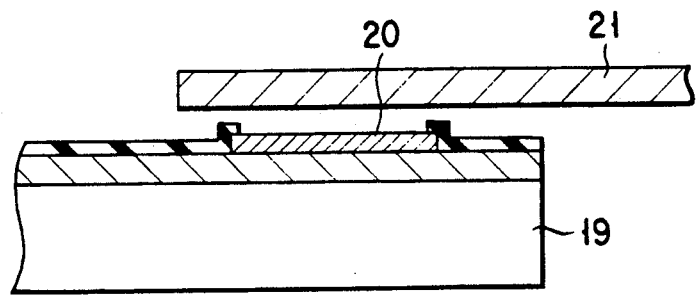
FIG. 2 is a cross sectional view showing the arrangement of a pad and a lead line before connection, for illustrating the connection method using the device shown in FIG. 1.
Figure 3:
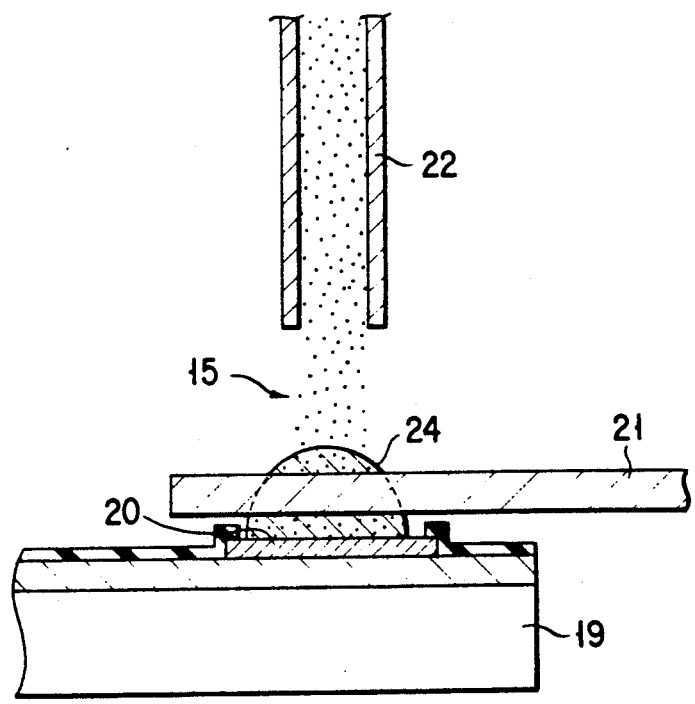
FIG. 3 is a cross sectional view showing the connection state of the pad and the lead line, for illustrating the connection method using the device shown in FIG. 1

A to-be-connected member, for example, a semiconductor chip is mounted on a mounting table 18 in the deposition chamber 17 and the semiconductor chip is heated to approx. 250° C. by means of a heating device 25. The pressure in the deposition chamber 17 is previously reduced to 0.1 Tort by means of a pump 23. When a lead wire and a pad of the semiconductor chip are connected to each other, a lead wire 21 with a diameter of approx. 30 $\mu$m is disposed near or in contact with a pad 20 of aluminum formed on a semiconductor chip 19 as shown in FIG. 2. Next, as shown in FIG. 3, a nozzle 22 for spraying superfine particles 15 is moved to directly above the pad 20 and lead wire 21 (to-be-connected portion) of the semiconductor chip 19. Then, the superfine particles 15 are sprayed together with the carrier gas from the nozzle 22 at a high speed of approx. 30 to 300 m/sec. and deposited on the pad 20 to a thickness of approx. 30 $\mu$m. As a result, the lead wire 21 is fixed on the pad 20 by means of a metal bump 24 of Au and is electrically connected in a desired condition. The created metal bump 24 has the same characteristic as bulk metal and can be created with a diameter of approx. 100 $\mu$m and a height of approx. 10 $\mu$m in a few seconds by adequately adjusting the conditions such as the spraying speed, the spraying time and the particle diameter of the superfine particles 15.

According to the above connection device and connection method, since it is not necessary to apply physical load such as heat, pressure and ultrasonic vibration to the connection portion, the small portions can be electrically connected without applying mechanical and thermal damages to elements formed in the semiconductor chip 19. Therefore, semiconductor elements can be formed in a portion near or directly under the bonding pad 20. Further, various conditions for connection can be alleviated in comparison with the connection method such as TAB and flip-chip bonding and the stable connection can be attained with the connection state and connection strength kept constant. The semiconductor chip 19 is heated to approx. 250° C. by the heating device 25, but the temperature is sufficiently lower than that set in the case of the wire bonding, TAB, flip-chip bonding or soldering and gives little influence on the characteristic of elements formed in the chip 19.

The inventor of this invention measured the size of the metal bump 24, the electrical resistance and the strength of fixation of the connected portion which is connected by use of the above connection device and connection method. As the result of the measurement, it was confirmed that the strength of fixation of the lead wire 21 on the pad 20 was more than 10 g and was sufficiently large in practical use. Further, the electrical resistance of the connected portion is equal to or less than 0.01Ω which is sufficiently low when compared with the electrical resistance obtained in the other connection method. In addition, it was confirmed that the size of the metal bump 24 could be reduced to less than 100 μm.

In the above embodiment, the superfine particles 15 of Au are used, but different metal such as Ni (nickel) or Cu (copper) may be used. As the result of the experiments, it was confirmed that He gas was most suitable as the carrier gas for forming the precise metal bump 24 and the highest bonding strength could be obtained. This is considered to be because He gas is an inert gas and can be easily removed even if it inadvertently goes into the metal bump 24 when the metal bump 24 is formed.

In the above embodiment, in order to simplify the explanation, connection for one portion is explained, but in practice, a large number of bonding pads are arranged on the outer peripheral portion of the chip.

In such a case, in order to enhance the operability, it is possible to simultaneously connect the pads by using nozzles of a number corresponding to the number of pads, setting the nozzles to face the respective pads and simultaneously spraying superfine particles from the nozzles. Further, as shown in FIG. 4, some of a plurality of nozzles 22-1 to 22-8 are selected according to the connection positions and superfine particles may be sprayed from the selected nozzles while the positions of the selected nozzles relative to the connection portions are sequentially shifted. That is, the nozzles are first set on a line ST1 and then superfine particles are sprayed from all of the nozzles 22-1 to 22-8 to simultaneously connect eight pads 20-1 to corresponding lead wires, for example. Next, the nozzles are moved and set on a line ST2 and then superfine particles are sprayed from the nozzles 22-1 and 22-8 to simultaneously connect two pads 20-2 to corresponding lead wires, for example. In the same manner as described above, the nozzles are sequentially shifted to lines ST3 to ST7 and then superfine particles are sprayed from the nozzles 22-1 and 22-8 in each position to simultaneously connect two pads 20-3, —, or 20-7 to respective lead wires, for example. Finally, the nozzles are moved and set on a line ST8 and then superfine particles are sprayed from all of the nozzles 22-1 to 22-8 to simultaneously connect eight pads 20-8 to corresponding lead wires, for example.

when the surface of the aluminum film of the bonding pad is contaminated by an alumina layer or the like, good electrical connection cannot be obtained even if a lead wire is connected to the alumina layer. In this case, the contamination layer may be removed by spraying relatively hard particles with relatively large diameter of several μm before spraying the superfine particles. In selecting a hard material, metal, ceramics, ice or dry ice which becomes solid when cooled may be used. After removing the contamination layer, superfine particles are sprayed as described before to attain the electrical connection. Further, it is also possible to form cracks 27 in the alumina layer 26 by spraying the above large particles as shown in FIG. 5 instead of completely removing the contamination layer, such as the alumina layer, and then form a metal bump 24 by spraying superfine particles to attain the electrical connection. In this case, the metal bump 24 and the pad 20 are electrically connected to each other via the cracks 27. Further, influence of the contamination layer can be eliminated by spraying a small amount of active superfine particles such as Ti (titanium), Cu (copper), Hf (hafnium), Zr (zirconium) or V (vanadium) and then spraying superfine particles such as Au (gold) or Ni (nickel) to attain the electrical connection. In this case, it is possible to spray Au or Ni superfine particles together with active (easily oxidized) superfine particles of, for example, Ti, Cu, Hf, Zr or V. The stronger and stabler connection can be attained by forming a conductive layer 28 of, for example, Ni, Cu, Ag (silver), W (tungsten) or the like on the surface of the bonding pad 20 by use of the plating method or selective CVD method as shown in FIG. 6 so as to improve the adhesive property on the surface of the pad 20 and then spraying superfine metal particles on the pad.

Figure 7:
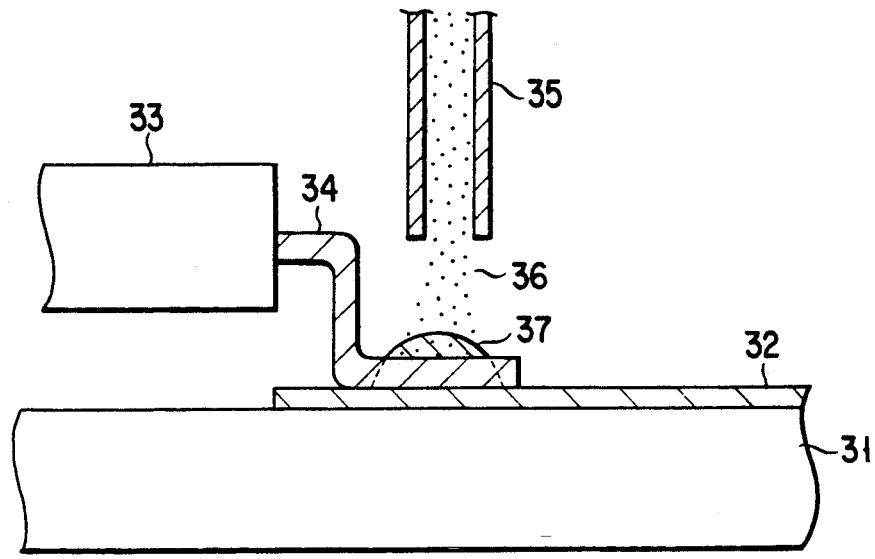
FIG. 7 is a cross sectional view showing the connection state of the lead wire of an electronic part and the wiring pattern formed on the printed-circuit board, for illustrating the connection method using the connection device shown in FIG. 1.

Next, a method of connecting electronic parts (such as LSIs) to the wiring patterns on the printed-circuit board by use of the connection device as shown in FIG. 1 is explained with reference to FIG. 7. First, a lead wire 34 of an electronic part 33 is set in contact with a wiring pattern (for example, Cu line) 32 on a printed-circuit board 31. After this, superfine metal particles (such as Ni superfine particles) 36 are sprayed on the connection portion from a nozzle 35 having a diameter which is substantially the same as the width of the lead wire 34. As a result, a metal bump 37 is formed to electrically connect the wiring pattern of the printed-circuit board 31 with the lead wire 34 of the electronic part 33.

Figure 8:
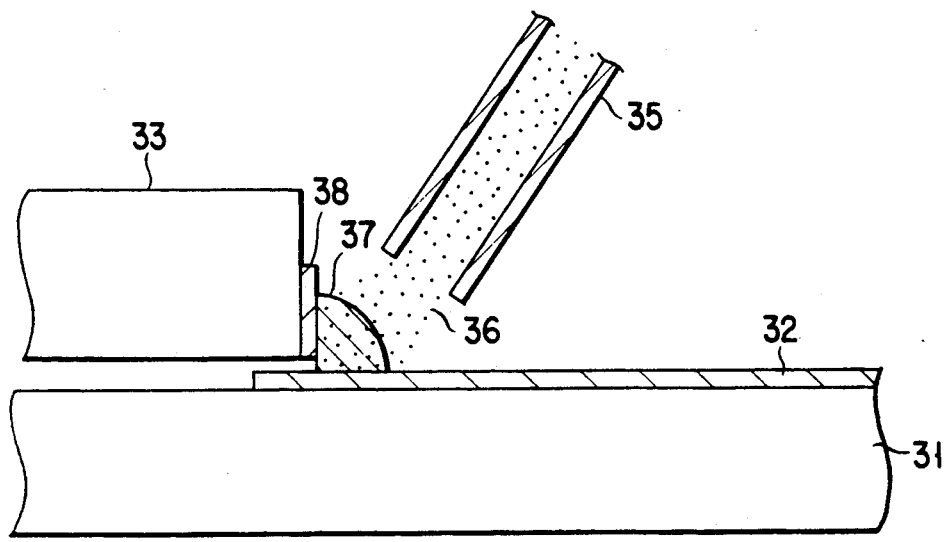
FIG. 8 is a cross sectional view showing the connection state of the lead portion of an electronic part and the wiring pattern formed on the printed-circuit board, for illustrating the connection method using the connection device shown in FIG. 1.

With the above connection method, a desired connection can be attained even in an electronic part which has no lead wire and which is required to be electrically connected in a lead portion 38 as shown in FIG. 8.

The above connection method can be applied to various electronic parts and various connection portions. For example, it can be applied to surface wave elements, resistance elements, capacitance elements and the like.

FIG. 9 schematically shows an example of the arrangement of the bonding pad of a semiconductor chip. With the connection method of this invention, since thermal and mechanical damages to the elements formed in the semiconductor substrate are less, bonding pads can be disposed on the elements. Even when the pitch between pads 20A and 20B is set to more than 100 μm, the pads 20A, 20B and 20C can be respectively connected to lead wires 21A, 21B and 21C in a narrow pitch pattern with a pitch substantially less than 100 μm by connecting the pads 20A, 20B and 20C to the lead wires 21A, 21B and 21C, disposing the pad 20C in position between the pads 20A and 20B and slightly deviated from a line connecting the pads 20A and 20B and then respectively connecting the pads 20A, 20B and 20C to the lead wires 21A, 21B and 21C.

When the lead wires are arranged in a narrow pitch pattern, there occurs a possibility that the adjacent lead wires may be set in contact with each other. Accordingly, as shown in FIG. 10, it is effective to cover a lead wire 21 with an organic insulative coating 40, for example, a Teflon or polyimide coating in order to prevent occurrence of the contact between the lead wires. In this case, at the time of connection of the lead wire 21, the organic insulative coating on the connection portion is thermally removed by use of a torch ($H_2$ and $O_2$ burner) or chemically removed by use of activated halogen gas or the like and then the lead wire 21 is fixedly connected to the pad by use of superfine metal particles. Further, as shown in FIG. 11, the lead wire 21 may be covered with an insulative coating 40 having cracks or gaps of several μm width formed therein at intervals of 10 to 20 μm. The insulative coating 40 may be formed of organic material such as Teflon or polyimide or inorganic material such as alumina or silicon oxide. In this case, at the time of connection of the lead wire 21, superfine metal particles are sprayed on the insulative coating 40 and the exposed portions of the lead wire 21 so as to fixedly connect the lead wire to the pad. With the above connection method, the cracks or gaps are filled with the superfine metal particles so that a good electrical connection can be attained.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An electrical connection method for connecting a first portion and a second portion, the method comprising the steps of:
   forming fine metal particles by vaporizing a metal in a first chamber and cooling the vaporized metal;
   carrying the fine metal particles i a carrier gas to a second chamber;
   positioning the first portion near or in contact with the second portion within the second chamber; and
   spraying the fine metal particles on said first and second portions to electrically connect the first and second portions.

2. A method according to claim 1, wherein said fine metal particles are formed of at least one metal selected from a group consisting of gold, nickel and copper.

3. A method according to claim 1, wherein said fine metal particles are said first and second potions.

4. A method according to claim 3, wherein said carrier gas includes at least one gas selected from a group consisting of helium gas, argon gas, hydrogen gas and nitrogen gas.

5. A method according to claim 1, wherein prior to the step of spraying the fine metal particles, the method further comprises the step of spraying hard particles on said first and second portions to remove contamination layers on said first and second portions.

6. A method according to claim 5, wherein said hard particles sprayed on said first and second portions to remove the contamination layers are harder and larger than said fine metal particles sprayed on to electrically connect said first and second portions.

7. A method according to claim 5, wherein said hard particles sprayed on said first and second portions to remove the contamination layers are fine metal particles which are active on oxygen.

8. A method according to claim 7, wherein said fine metal particles which are active on oxygen are formed of at least one metal selected from a group consisting of titanium, copper, hafnium, zirconium and vanadium.

9. An electrical connection method for connecting a first member and a second member, the method comprising the steps of:
   forming fine metal particles by vaporizing a metal and cooling the vaporized metal;
   carrying said fine metal particles together with carrier gas;
   positioning the first member near or in contact with the second member; and
   spraying the fine metal particles together with the carrier gas on said first and second members to electrically connect the first and second members by fixedly attaching a metal bump thereto.

10. A method according to claim 9, wherein said fine metal particles are formed of at least one metal selected from a group consisting of gold, nickel and copper.

11. A method according to claim 9, wherein said carrier gas includes at least one gas selected from a group consisting of helium gas, argon gas, hydrogen gas and nitrogen gas.

12. A method according to claim 9, wherein prior to the step of spraying the fine metal particles, the method further comprises the step of spraying hard particles on said first and second members to remove contamination layers on said first and second members.

13. A method according to claim 12, wherein said hard particles sprayed on said first and second members to remove the contamination layers are harder and larger then said fine metal particles sprayed on to electrically connect said first and second members.

14. A method according to claim 12, wherein said hard particles sprayed on said first and second members to remove the contamination layers are fine metal particles which are active on oxygen.

15. A method according to claim 14, wherein said fine metal particles which are active on oxygen are formed of at least one metal selected from a group consisting of titanium, copper, hafnium, zirconium and vanadium.

* * * * *